(12) United States Patent
Lee

(10) Patent No.: US 7,880,122 B2
(45) Date of Patent: Feb. 1, 2011

(54) WAFER HAVING THERMAL CIRCUIT AND POWER SUPPLIER THEREFOR

(75) Inventor: Young-Weon Lee, Seoul (KR)

(73) Assignee: Joeun Technology Co., Ltd. (KR)

( * ) Notice: Subject to any disclaimer, the term of this patent is extended or adjusted under 35 U.S.C. 154(b) by 610 days.

(21) Appl. No.: 11/572,730

(22) PCT Filed: Jul. 28, 2004

(86) PCT No.: PCT/KR2005/001896

§ 371 (c)(1),
(2), (4) Date: Jul. 16, 2007

(87) PCT Pub. No.: WO2006/011712

PCT Pub. Date: Feb. 2, 2006

(65) Prior Publication Data

US 2008/0130237 A1    Jun. 5, 2008

(30) Foreign Application Priority Data

Jul. 28, 2004   (KR) ..................... 10-2004-0059197

(51) Int. Cl.
*H05B 3/68*    (2006.01)
*C23C 16/00*   (2006.01)
(52) U.S. Cl. .................................. 219/444.1; 118/724
(58) Field of Classification Search ... 219/443.1–468.2; 118/724, 725

See application file for complete search history.

(56) References Cited

U.S. PATENT DOCUMENTS 4,351,996 A * 9/1982 Kondo et al. ............... 219/625
4,432,635 A   2/1984 Mayer
5,670,889 A * 9/1997 Okubo et al. .............. 324/760

(Continued)

FOREIGN PATENT DOCUMENTS

JP       04-56765      2/1992

(Continued)

OTHER PUBLICATIONS

International Search Report; PCT/KR2005/001896; Sep. 27, 2005.

*Primary Examiner*—Sang Y Paik
(74) *Attorney, Agent, or Firm*—Cantor Colburn LLP

(57) ABSTRACT

Provided are a wafer having a thermal circuit and power supplier therefor, which enable the wafer to heat or cool itself without using any additional heating or cooling system. The wafer includes the thermal circuit that is installed on one side of the wafer to be capable of self-heating or self-cooling the wafer in order to perform a heating process or cooling process on a semiconductor device formed on the surface of the wafer and exchanges heat with the semiconductor device. Thus, a temperature of a semiconductor device can be precisely controlled, and heating and cooling energies are greatly reduced through a direct heat exchange method, thus attaining high efficiency. Since the thermal circuit is directly installed in the wafer, it is structurally simple and the costs of production and installation can be notably reduced. Also, the present invention is very advantageous for optimization, miniaturization, simplification, and environmentally friendly production of a wafer heating/cooling system. Furthermore, a temperature measuring circuit is installed on a reverse surface of the wafer so that the amount of energy that acts on an actual semiconductor device or actual temperature can be accurately measured in real time.

10 Claims, 9 Drawing Sheets

U.S. PATENT DOCUMENTS

| | | | |
|---|---|---|---|
| 6,114,674 A * | 9/2000 | Baugh et al. | 219/543 |
| 6,257,758 B1 * | 7/2001 | Culbertson | 374/120 |
| 6,552,308 B2 * | 4/2003 | Nishimura | 219/497 |
| 6,664,515 B2 | 12/2003 | Natsuhara et al. | |
| 7,071,551 B2 * | 7/2006 | Hiramatsu et al. | 257/710 |
| 2004/0065656 A1 * | 4/2004 | Inagawa et al. | 219/444.1 |

FOREIGN PATENT DOCUMENTS

| | | |
|---|---|---|
| JP | 11-168056 | 6/1999 |
| JP | 2004-134723 | 4/2004 |
| KR | 1020000061765 A | 10/2000 |

\* cited by examiner

WAFER HAVING THERMAL CIRCUIT AND POWER SUPPLIER THEREFOR

CROSS-REFERENCE TO RELATED PATENT APPLICATION

This application claims the benefit of Korean Patent Application No. 10-2004-0059197, filed on 28 Jul. 2004 in the Korean Intellectual Property Office, the disclosure of which is incorporated herein in its entirety by reference.

BACKGROUND OF THE INVENTION

1. Field of the Invention

The present invention relates to a wafer having a thermal circuit and a power supplier therefor, and more particularly, to a wafer having a thermal circuit and power supplier therefor, which enable the wafer to be heated or cooled without any additional heating or cooling system.

2. Description of the Related Art

In general, a semiconductor device is fabricated through a plurality of processes including an ion implantation process, a layer deposition process, a diffusion process, and a photolithography process. Among these processes, the photolithography process, which is carried out to form a desired pattern, is an essential process for the fabrication of the semiconductor device.

In the photolithography process, a mask pattern or a reticle pattern is formed on the semiconductor device in order to selectively define a region to be doped and a region to be protected. Conventionally, such a photolithography process includes a coating process in which a photoresist is dropped on the device which rotates at high speed so that the photoresist is coated on the device to a desired thickness, an exposure process in which the device coated with the photoresist and a predetermined mask are aligned to each other and the photoresist coated on the device is irradiated with ultraviolet (UV) rays through the mask so that a mask pattern or reticle pattern is transferred on the device, and a developing process in which the photoresist coated on the device, which underwent the exposure process, is developed to form a desired photoresist pattern.

Furthermore, the photolithography process includes a baking process in which the semiconductor device is baked at a predetermined temperature. Specifically, the baking process can be categorized into a baking process required for removing moisture absorbed on the device before the photoresist is coated, a soft baking process performed after a predetermined organic solvent and the photoresist are coated, and a post-exposure baking (PEB) process required for repairing instability of a chemical structure of an exposed portion caused by the scattering of UV rays during the exposure process.

In order to bake the semiconductor device as described above, a wafer heating system, which is a type of semiconductor fabrication equipment, is used to substantially conduct a wafer baking process in a bake chamber.

A conventional wafer heating system is widely used not only for the above-described photolithography process but also to heat a wafer during a variety of processes. The conventional wafer heating system includes: a flat heating plate, which is installed in close vicinity to a wafer to transmit heat to the wafer; and a heater, which is installed on a bottom surface of or inside the heating plate to heat the heating plate.

Meanwhile, a conventional wafer cooling system, which serves to cool off a heated wafer, includes: a flat cooling plate, which is installed in close vicinity to the wafer to exchange heat with the wafer; and a cooling wafer line, which is installed on a bottom surface of or inside the cooling plate to cool the cooling plate.

However, in the conventional wafer heating system (cooling system), a wafer is mounted on the heating plate (cooling plate), and heater (cooling wafer line) heats (cools) the heating plate (cooling plate) to heat (cool) air near the reverse surface of the wafer. In other words, since the wafer cannot be directly heated (cooled), the heater (cooling wafer line) primarily exchanges heat with the heating plate (cooling plate), the heating plate (cooling plate) secondarily exchanges heat with an air layer near the reverse surface of the wafer, and the air layer near the reverse surface of the wafer thirdly exchanges heat with the wafer. In addition to the multi-step heat exchange process, it is difficult to control heat conduction for each heat exchange process. That is, owing to unstable heat convection in the air layer, it is very difficult to heat (cool) the semiconductor device disposed on the wafer to a desired temperature. Thus, a lot of heating (cooling) energy is wasted so that the system's efficiency is deteriorated. Further, because the conventional wafer heating (cooling) system is separately installed from the wafer and structurally complicated, it takes much time and cost to produce and install the system.

Also, in the conventional wafer heating system or cooling system, the heater is unnecessarily large-sized, a coolant, such as cooling water, is high-priced, and a variety of contaminants are generated, thus polluting the environment.

Meanwhile, a conventional wafer temperature measuring system also cannot precisely measure the amount of thermal energy that acts on the semiconductor device or actual temperature in real time because the system is separately installed from the wafer (e.g., an additional test wafer is used or a sensor is installed in vicinity of a wafer to measure temperature).

SUMMARY OF THE INVENTION

The present invention provides a wafer having a thermal circuit and power supplier therefor, in which the thermal circuit is installed in the wafer to self-heat the wafer, so that a temperature of a semiconductor device can be precisely controlled, and heating and cooling energies are greatly reduced through a direct heat exchange method, thus attaining high efficiency. Since the thermal circuit is directly installed in the wafer, it is structurally simple and the costs of production and installation can be notably reduced.

Also, the present invention provides a wafer having a thermal circuit and a power supplier therefor, which are very advantageous for optimization, miniaturization, simplification, and environmentally friendly production of a wafer heating/cooling system.

Furthermore, the present invention provides a wafer having a thermal circuit and power supplier therefor, in which a temperature measuring circuit is installed on a reverse surface of the wafer so that the amount of energy that acts on an actual semiconductor device or actual temperature can be accurately measured in real time.

According to an aspect of the present invention, there is provided a wafer including a thermal circuit that is installed on one side of the wafer to be capable of self-heating or self-cooling the wafer in order to perform a heating process or cooling process on a semiconductor device formed on the surface of the wafer and exchanges heat with the semiconductor device.

In one embodiment, the thermal circuit may include a plurality of blocks, which are formed on a reverse surface of the wafer and correspond to at least one semiconductor device chip formed on a front surface of the wafer. In another embodiment, the thermal circuit may include a plurality of blocks from the center of a reverse surface of the wafer to the edge thereof, and an insulation groove may be formed between every two blocks to reduce thermal interference between the blocks.

In one embodiment, the thermal circuit may include a thermal line pattern, which is converted into an electric heating material by implanting impurities, such as $SiO_2$, C, or other required metal, into the reverse surface of the wafer using an ion implantation process or adhered using an adhesion process; and a connection portion, which is formed on both end portions of the thermal line pattern such that power is supplied to the thermal line pattern by a selective contact of a connection needle. In another embodiment, the thermal circuit may include an electric heating plate, which is widely formed on the reverse surface of the wafer using an adhesion process or an ion implantation process and formed of an electric heating material; and a connection portion, which is formed on an electrode of the electric heating plate such that power is supplied to the electric heating plate by a selective contact of a connection needle. In still another embodiment, the thermal circuit may include a Peltier device, which is formed on the reverse surface of the wafer using an ion implantation process or adhered using an adhesion process; and a connection portion, which is formed on an electrode of the Peltier device such that power is supplied to the Peltier device by a selective contact of a connection needle.

Furthermore, the wafer having the thermal circuit may further include a temperature measuring circuit, which is formed on the other side of the wafer to measure the temperature of the semiconductor device formed on the surface of the wafer.

According to another aspect of the present invention, there is provided a power supplier of a wafer having a thermal circuit that is installed on one side of the wafer to be capable of self-heating or self-cooling the wafer in order to perform a heating process or cooling process on a semiconductor device formed on the surface of the wafer. The power supplier includes; a connection needle, which is connected to the thermal circuit of the wafer mounted on a wafer rest; a power supply unit, which supplies power to the thermal circuit through the connection needle; and a control unit, which controls the current and voltage of the power supply unit.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Hereinafter, the present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art.

A wafer having a thermal circuit and power supplier therefor according to the present invention will now be described more fully hereinafter with reference to the accompanying drawings, in which exemplary embodiments of the invention are shown.

Figure 1:
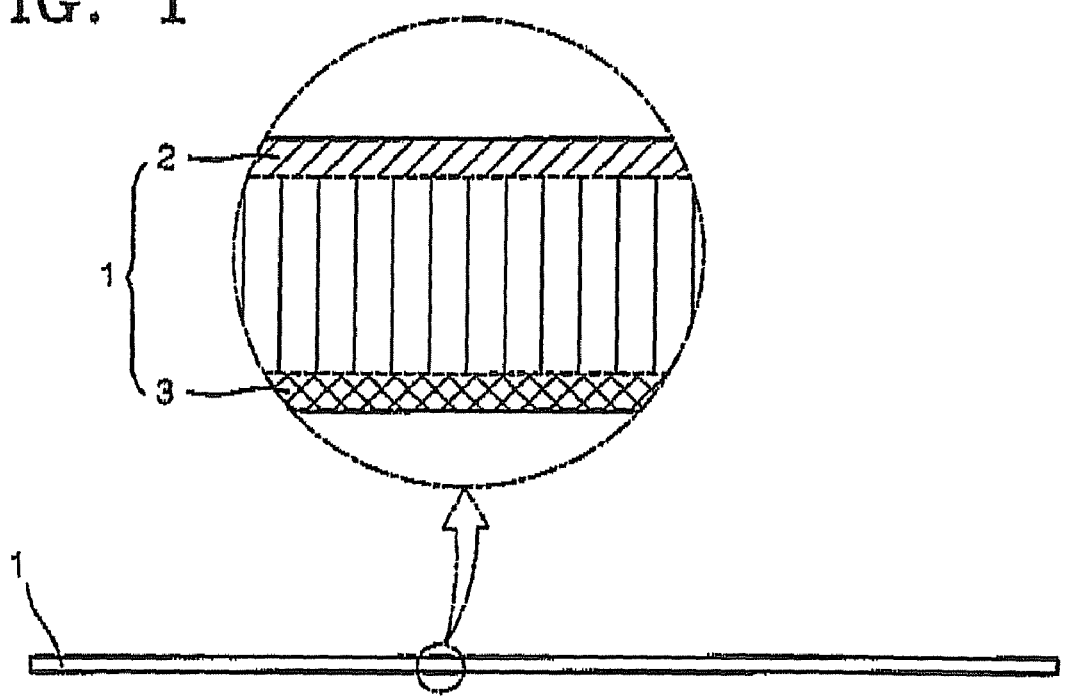
FIG. 1 is a lateral cross sectional view of a wafer having a thermal circuit according to an exemplary embodiment of the present invention.

Referring to FIG. 1, a wafer 1 includes a thermal circuit 3 that is installed on a reverse surface of the wafer 1 to self-heat or self-cool the wafer in order to perform a heating process or cooling process on a semiconductor device 2 formed on the surface of the wafer 1 and exchanges heat with the semiconductor device 2. Thus, the thermal circuit 3 can directly exchange heat with the semiconductor device 2 formed on a top surface of the wafer 1.

Thus, since the thermal circuit 3 is installed in the vicinity of the semiconductor device 2, it can easily raise or drop the temperature of the semiconductor device 2 with small energy. Also, since heat is transmitted only through thermal conductance very precise heat control is possible.

In particular, the thermal circuit 3 may be formed on an inner surface or top surface of the wafer 1, but it is preferable that the thermal circuit 3 be formed on the reverse surface of the wafer 1 where no semiconductor device 2 is formed.

Figure 2:
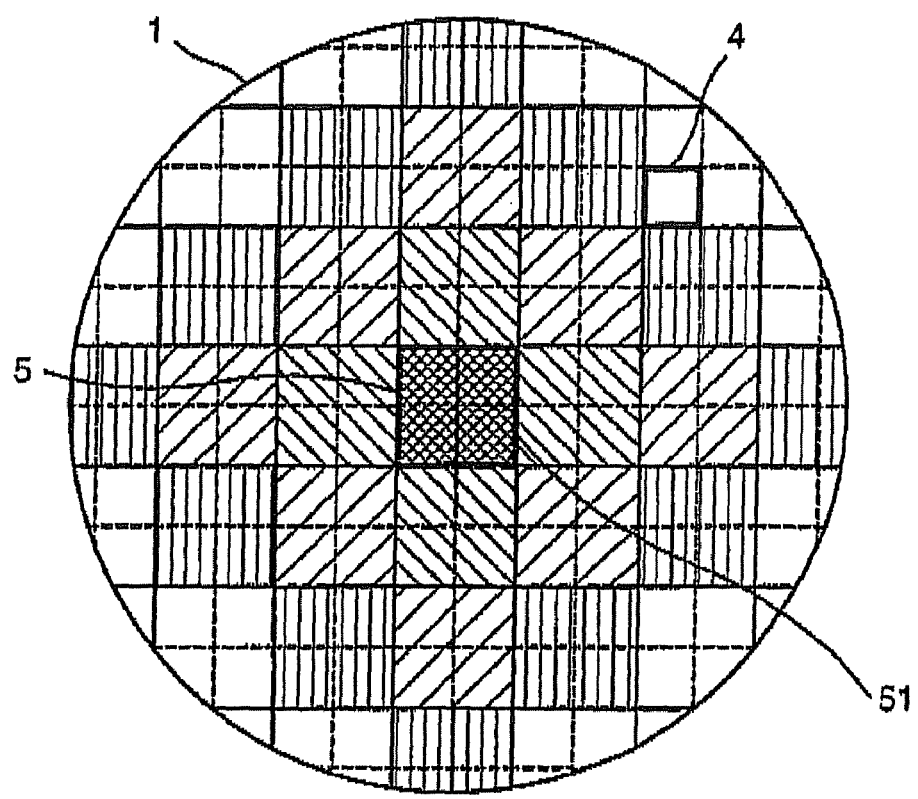
FIG. 2 is a bottom view of an example of a reverse surface of the wafer having the thermal circuit shown in FIG. 1.

Meanwhile, referring to FIG. 2, the thermal circuit 3 may include a plurality of rectangular, cruciform, or staircase-type blocks 5, which are formed on the reverse surface of the wafer 1 and correspond to at least one semiconductor device chip 4 formed on a front surface of the wafer 1. Alternatively, as can be seen from FIGS. 11 through 18, the thermal circuit 3 may include a plurality of circular, annular, or fan-shaped blocks 5 from the center of the reverse surface of the wafer 1 to the edge thereof.

As shown in FIG. 2, an insulation groove 51 may be formed between every two blocks 5 to reduce the thermal interference between the blocks 5, so that thermal conductance between the blocks 5 can be cut off. Here, the insulation groove 51 may be replaced by a variety of other elements, for example, an insulation material filled between the blocks 5 or an insulation layer/film formed between the blocks 5.

Figure 3:
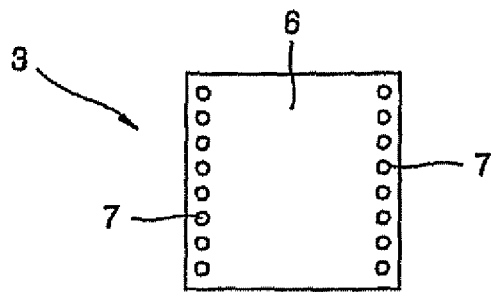
FIGS. 3 through 10 illustrate various examples of a thermal circuit block shown in FIG. 2.
Figure 4:
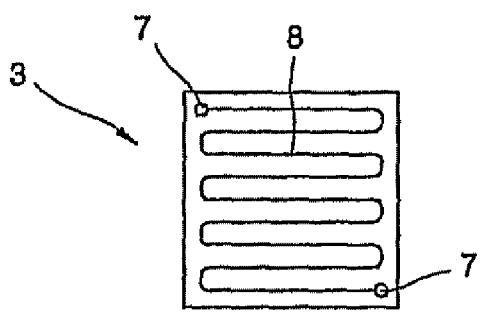
Figure 5:
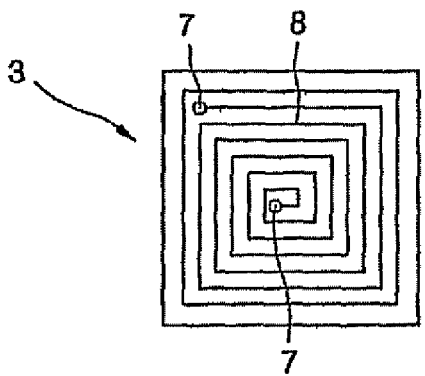
Figure 6:
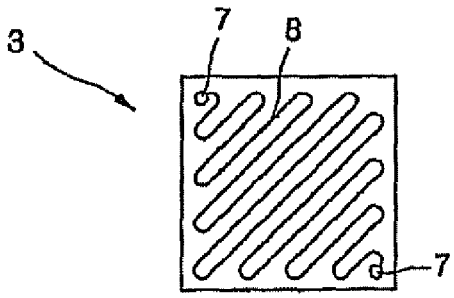
Figure 7:
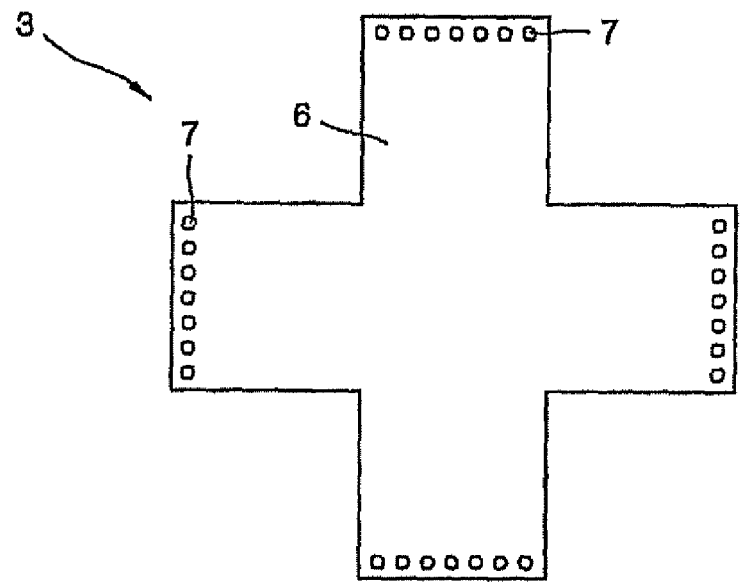
Figure 8:
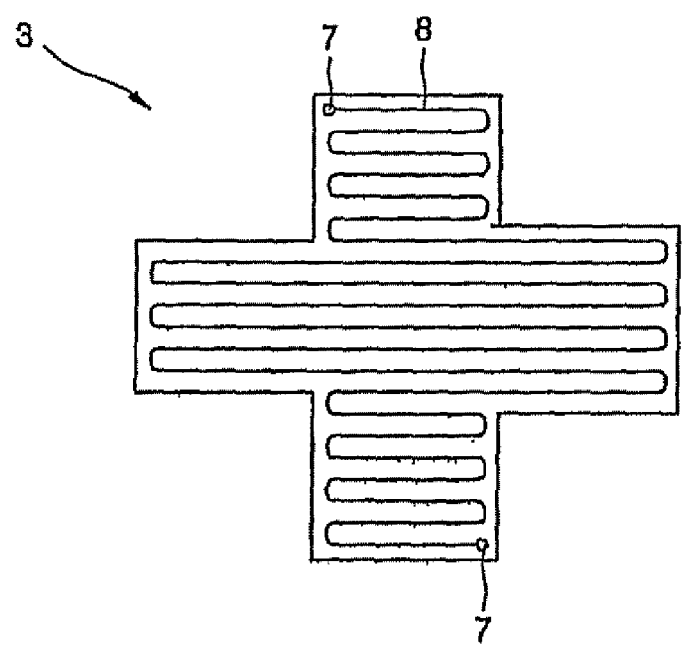
Figure 9:
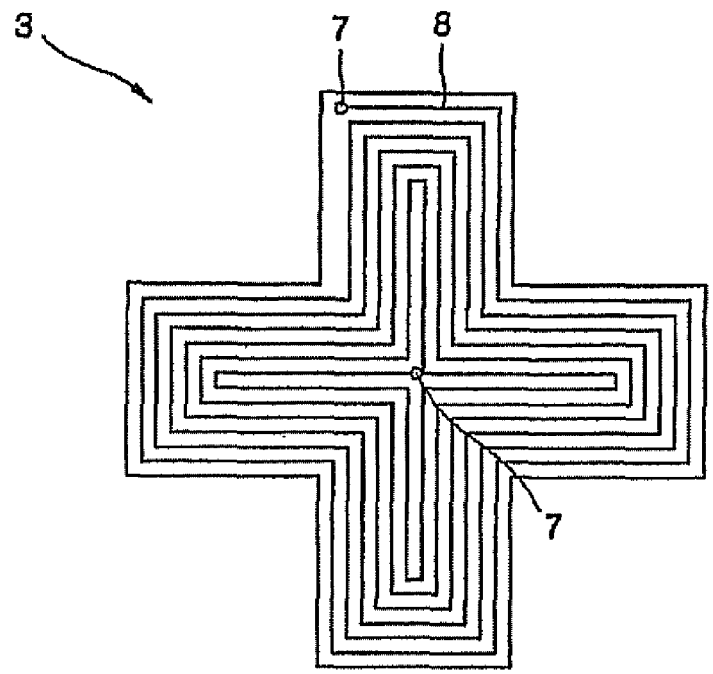
Figure 10:
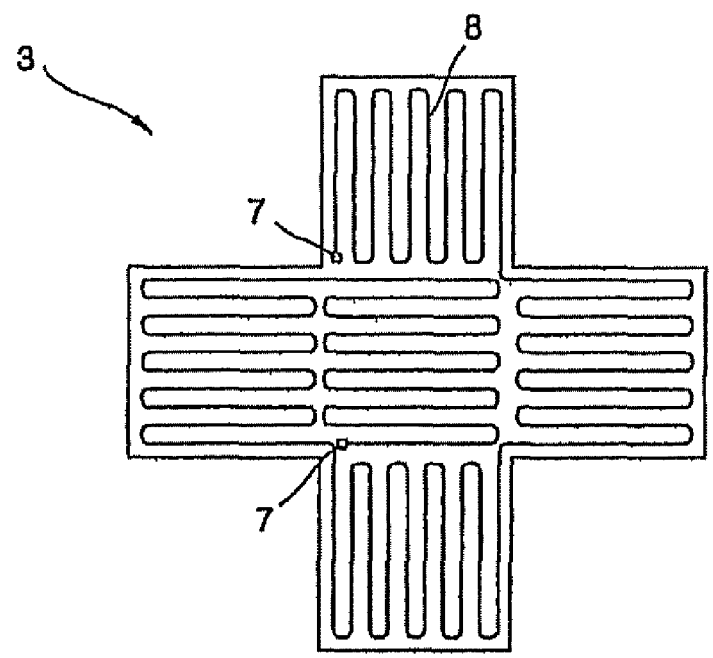
Figure 11:
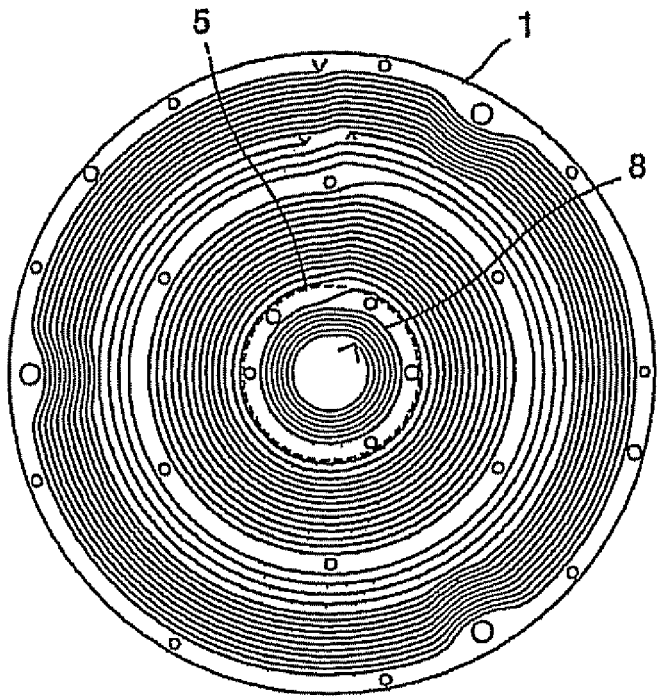
FIGS. 11 through 18 are bottom views of other examples of the reverse surface of the wafer having the thermal circuit shown in FIG. 1.
Figure 12:
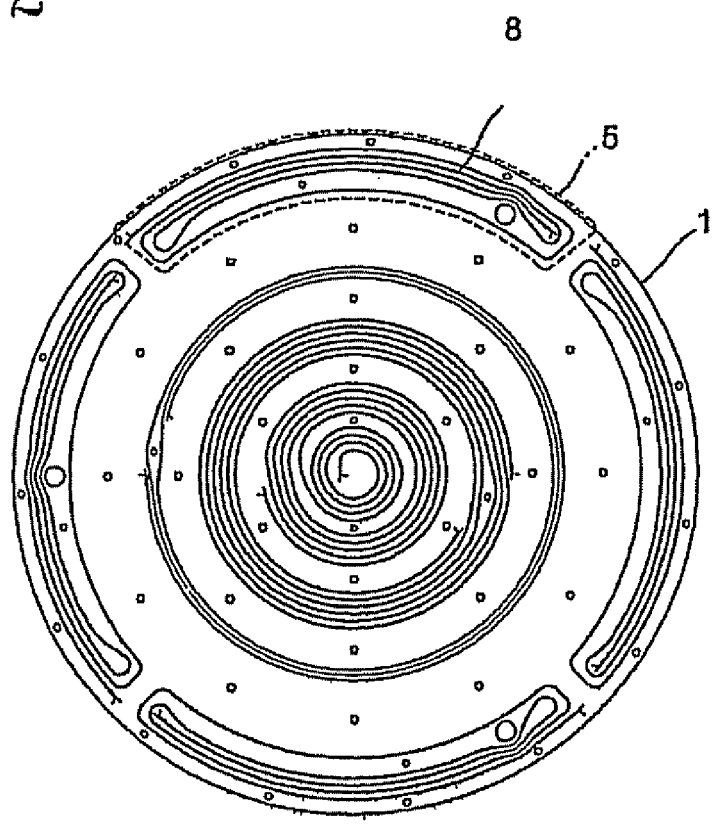
Figure 13:
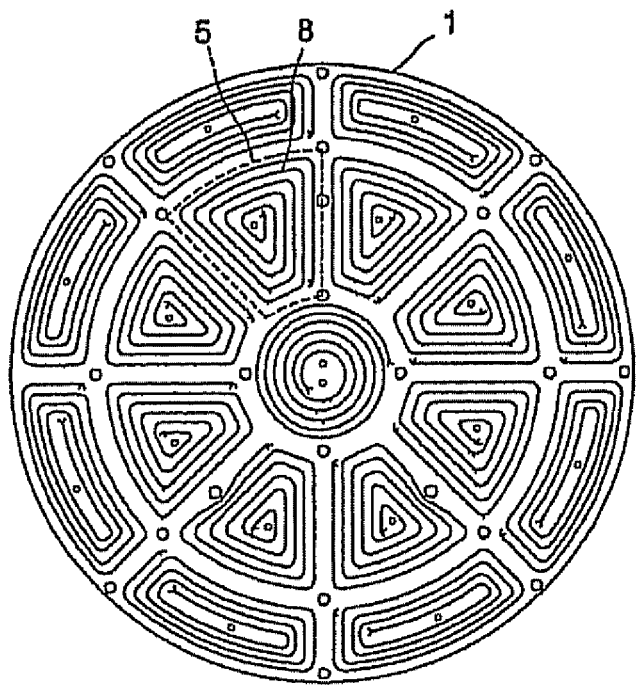
Figure 14:
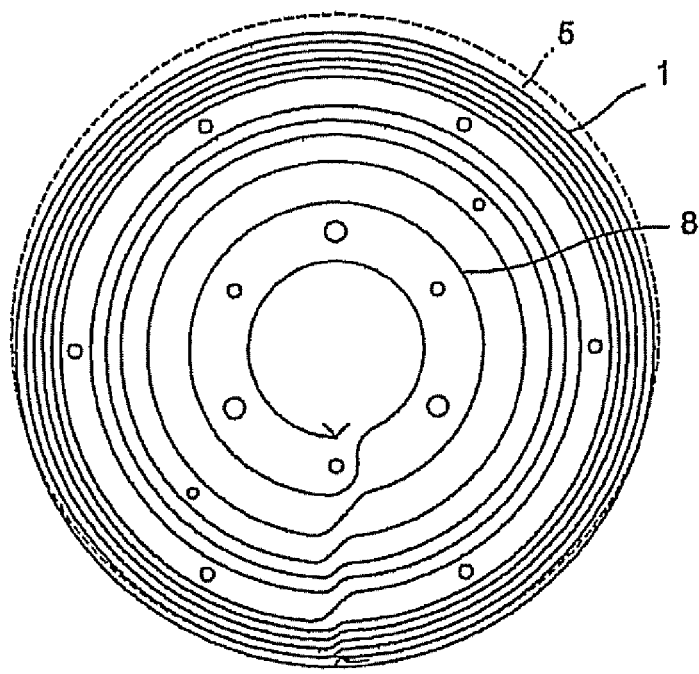
Figure 15:
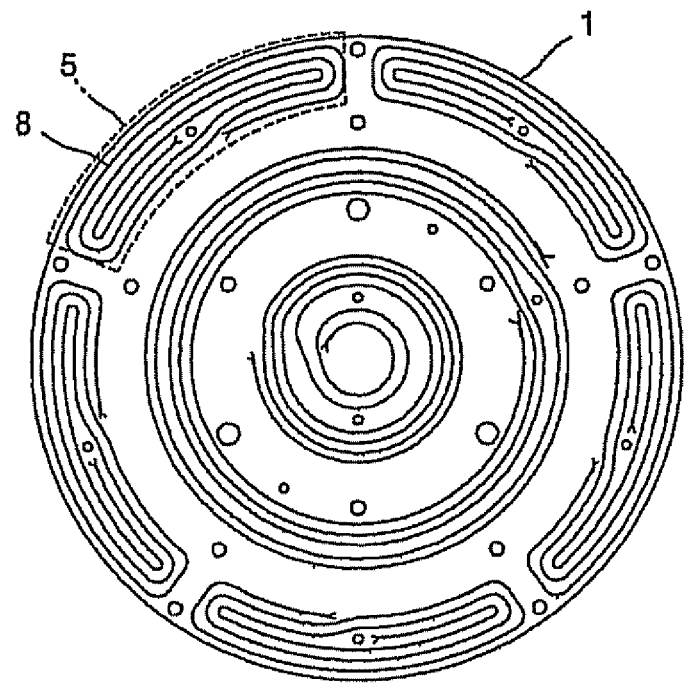
Figure 16:
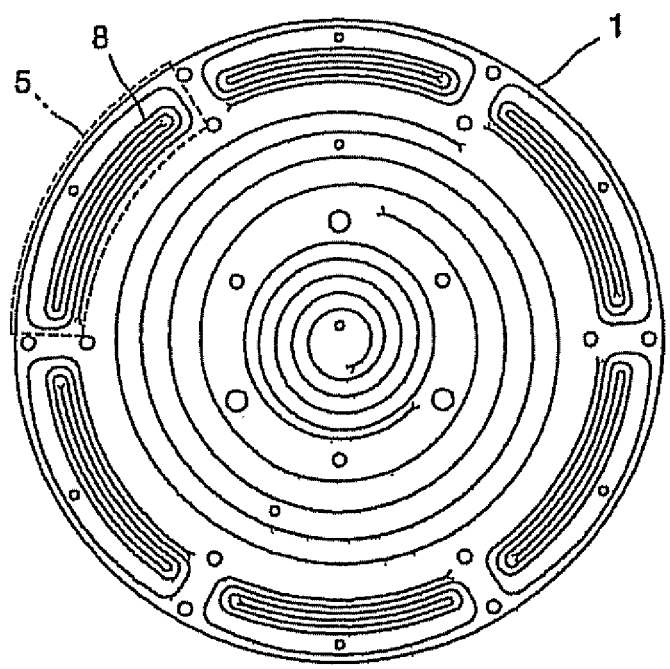

Meanwhile, as shown in FIGS. 3 through 18, the thermal circuit 3 in the block 5 may be formed in various patterns. Firstly, referring to FIGS. 3 and 7, the thermal circuit 3 may include an electric heating plate 6, which is widely formed on the reverse surface of the wafer using an adhesion process or an ion implantation process and formed of an electric heating material, and a connection portion 7, which is formed on an electrode of the electric heating plate 6 such that power is supplied to the electric heating plate 6 by a selective contact of a connection needle 11 that will be described later with reference to FIG. 20. That is, the electric heating plate 6 may be a large-area plate that is heated when power is supplied thereto.

Figure 20:
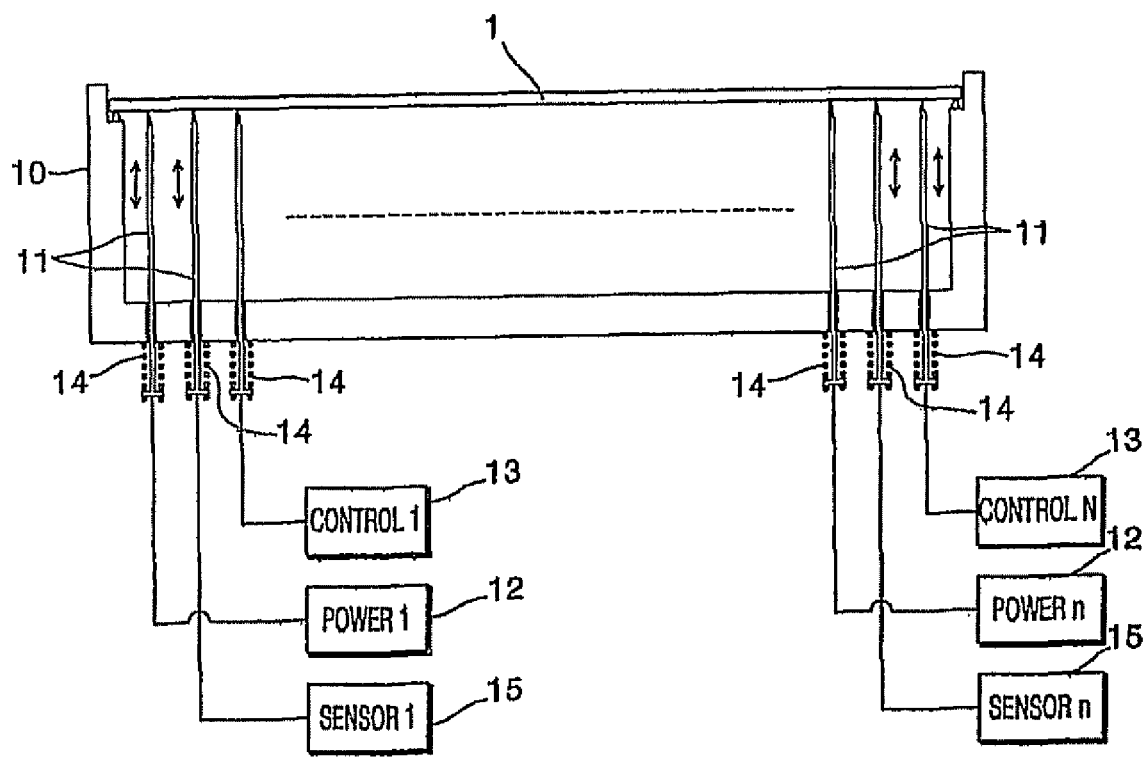
FIG. 20 is a conceptual diagram of a power supplier of a wafer having a thermal circuit according to an exemplary embodiment of the present invention.

In another case, as shown in FIGS. 4, 5, 6, 8, 9, and 10, the thermal circuit 3 may include a thermal line pattern 8, which is converted into an electric heating material by implanting impurities, such as $SiO_2$, C, or other required metal, into the reverse surface of the wafer using an ion implantation process or adhered using an adhesion process, and a connection portion 7, which is formed on both end portions of the thermal line pattern 8 such that power is supplied to the thermal line pattern 8 by a selective contact of a connection needle 11, which will be described with reference to FIG. 20.

Figure 17:
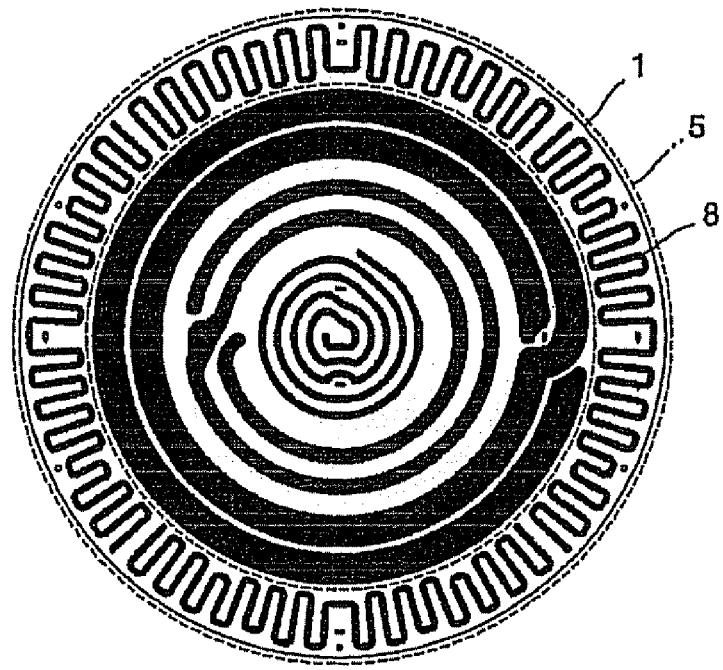
Figure 18:
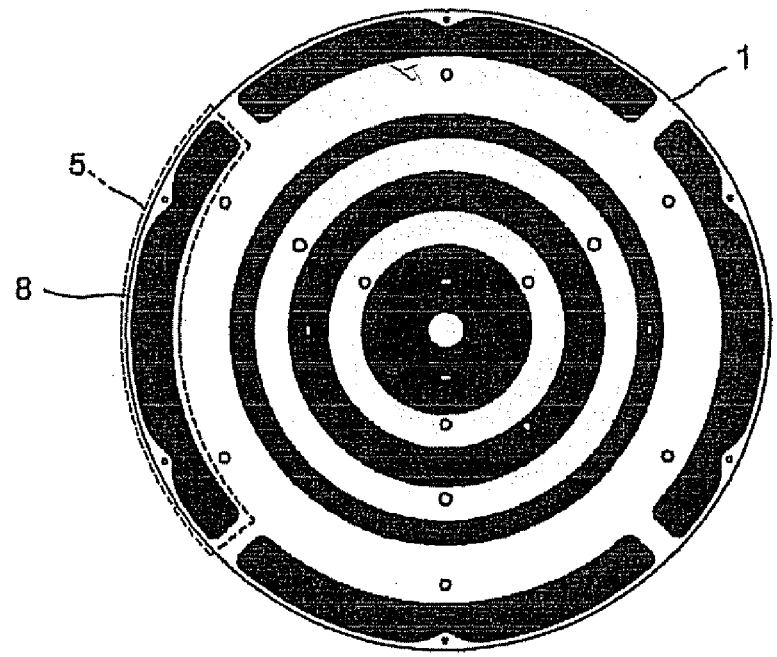

Here, the thermal line pattern 8 may be a very thin wire type or a relatively thick plane type shown in FIGS. 17 and 18.

Figure 19:
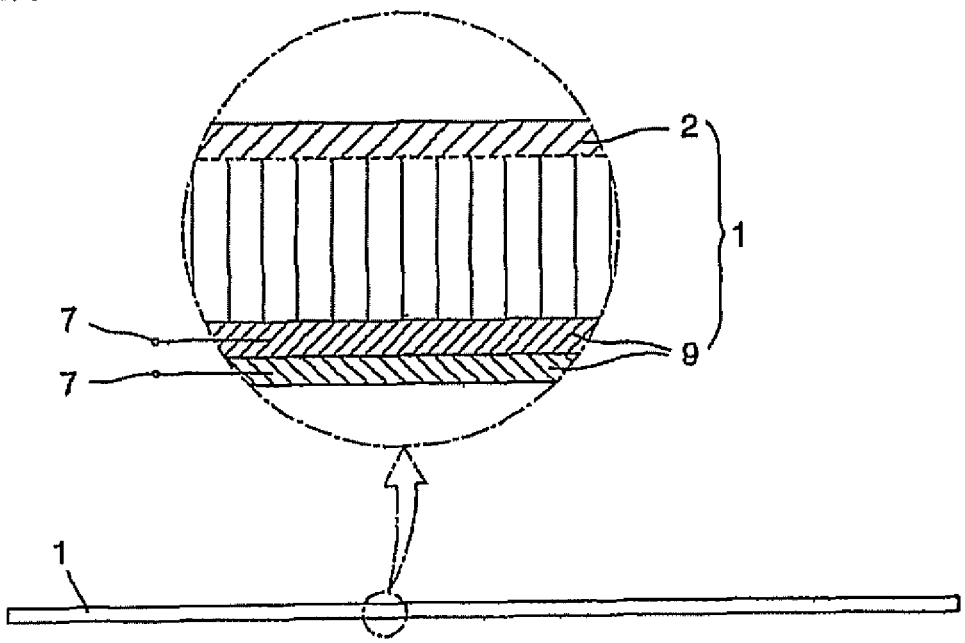
FIG. 19 is a lateral cross sectional view of a wafer having a thermal circuit according to another exemplary embodiment of the present invention.

Meanwhile, in addition to the electric heating plate 6 or the thermal line pattern 8, as shown in FIG. 19, the thermal circuit 3 may include a Peltier device 9, which is formed on the reverse surface of the wafer 1 using an ion implantation process or adhered using an adhesion process, and a connection portion 7, which is formed on an electrode of the Peltier device 9 such that power is supplied to the Peltier device 9 by a selective contact of a connection needle 11 that will be described later with reference to FIG. 20.

By changing the direction of the electrode of the Peltier device 9, the wafer 1 can be heated and cooled very rapidly and efficiently.

Here, since the Peltier device 9 is well-known and commonly used in the art, a technical description thereof will be omitted.

Although not shown in the drawings, the wafer 1 having the thermal circuit 3 may further include a temperature measuring circuit, which is formed on the other surface of the wafer 1 to measure the temperature of the semiconductor device 2 formed on the surface of the wafer 1.

Here, the temperature measuring circuit also is well-known and commonly used in the art for a test wafer and may not only measure a temperature but also include a storage circuit for storing data on measured temperature.

Meanwhile, as shown in FIG. 20, a power supplier for a wafer having a thermal circuit according to the present invention is used to supply power to the above-described wafer 1 having the thermal circuit 3 that is installed on one side of the wafer 1 to be capable of self-heating or self-cooling the wafer 1 in order to perform a heating process or cooling process on the semiconductor device 2 formed on the surface of the wafer 1. The power supplier includes: a connection needle 11, which is connected to the thermal circuit 3 of the wafer 1 mounted on a wafer rest 10; a power supply unit 12, which supplies power to the thermal circuit 3 through the connection needle 11; and a control unit 13, which controls the current and voltage of the power supply unit 12.

Thus, when the wafer 1 having the thermal circuit 3 is mounted on the wafer rest 10, power is supplied from the power supply unit 12 through the connection needle 11 to the thermal circuit 3 formed on the reverse surface of the wafer 1, the current and voltage of the power supplied to the thermal circuit 3 are controlled by the control unit 13, so that the thermal circuit 3 can heat or cool the semiconductor device 2 formed on the top surface of the wafer 1 to a desired temperature.

Meanwhile, as shown in FIG. 20, the connection needle 11 is installed to be capable of freely moving up and down on the basis of the wafer rest 10, and a front tip of the connection needle 11 is pressurized toward the wafer 1 due to restitutive force of an elastic spring 14. Thus, when the thermal circuit 3 comes into contact with the connection portion 7, cohesion of the power supplier with the connection portion 7 of the thermal circuit 3 is reinforced, so that wafer contact failure or serious collision can be prevented.

Also, the power supplier may further include a temperature sensor 15, which is installed to be capable of freely moving up and down on the basis of the wafer rest 10, wherein the temperature of the wafer 1 is measured by pressurizing a front tip of the temperature sensor 15 toward the wafer 1 due to restitutive force of an elastic spring 14 until the front tip contacts the wafer 1. Thus, the temperature of the wafer 1 can be measured more precisely in real time.

While the present invention has been particularly shown and described with reference to exemplary embodiments thereof, it will be understood by those of ordinary skill in the art that various changes in form and details may be made therein without departing from the spirit and scope of the present invention as defined by the following claims.

For example, the shape or kind of the thermal circuit, wafer rest, or connection tip according to the present invention can be variously changed and are not restricted to the above-described description and drawings.

According to the present invention as described above, a thermal circuit is installed in a wafer so that the wafer can heat or cool itself. Thus, a temperature of a semiconductor device can be precisely controlled, and heating and cooling energies are greatly reduced through a direct heat exchange method, thus attaining high efficiency. Since the thermal circuit is directly installed in the wafer, it is structurally simple and the costs of production and installation can be notably reduced. Also, the present invention is very advantageous for optimization, miniaturization, simplification, and environmentally friendly production of a wafer heating/cooling system. Furthermore, a temperature measuring circuit is installed on a reverse surface of the wafer so that the amount of energy that acts on an actual semiconductor device or actual temperature can be accurately measured in real time.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A wafer which performs self-heating or self-cooling, the wafer comprising a thermal circuit adhered to an upper surface or a lower surface of the wafer and which heats or cools the wafer, wherein a heating process or cooling process on a semiconductor device formed on the upper surface of the wafer is performed by exchanging heat between the wafer and the semiconductor device.

2. The wafer according to claim 1, wherein the thermal circuit includes a plurality of blocks formed on the lower surface of the wafer and correspond to at least a portion of the semiconductor device formed on the upper surface of the wafer.

3. The wafer according to claim 1, wherein the thermal circuit includes a plurality of blocks formed from the center portion of the lower surface of the wafer to the edge thereof, and an insulation groove is formed on the lower surface between every two blocks to reduce thermal interference between the blocks.

4. The wafer according to claim 1, wherein the thermal circuit comprises:
a thermal line pattern formed on the lower surface using an ion implantation process which converts a portion of the lower surface of the wafer into an electric heating material by implanting impurities thereinto or using an adhesion process which adheres an electric heating material to the portion of the lower surface of the wafer; and a connection portion formed on each end portion of the thermal line pattern and through which power is supplied to the thermal line pattern by a selective contact of a connection needle.

5. The wafer according to claim 1, wherein the thermal circuit comprises:
   an electric heating plate formed on a portion of the lower surface of the wafer using an ion implantation process which converts a portion of the lower surface of the wafer into an electric heating material by implanting impurities thereinto or using an adhesion process which adheres an electric heating material to the portion of the lower surface of the wafer; and
   a connection portion formed on an electrode of the electric heating plate and through which power is supplied to the electric heating plate by a selective contact of a connection needle.

6. The wafer according to claim 1, wherein the thermal circuit includes:
   a Peltier device formed on the lower surface of the wafer using an ion implantation process which converts a portion of the lower surface of the wafer into an electric heating material by implanting impurities thereinto or using an adhesion process which adheres an electric heating material to the portion of the lower surface of the wafer; and
   a connection portion formed on an electrode of the Peltier device and through which power is supplied to the Peltier device by a selective contact of a connection needle.

7. The wafer according to claim 1, further comprising a temperature measuring circuit formed on a surface of the wafer opposite to the surface on which the thermal circuit is formed and which measures the temperature of the semiconductor device formed on the upper surface of the wafer.

8. A power supplier for a wafer which performs self-heating or self-cooling, including a thermal circuit adhered to an upper surface or a lower surface of the wafer and heats or cools the wafer, the power supplier comprising:
   a connection needle connected to the thermal circuit of the wafer disposed on a wafer rest;
   a power supply unit, which supplies power to the thermal circuit through the connection needle; and
   a control unit, which controls a current and a voltage of a power supply unit.

9. The power supplier according to claim 8, wherein the connection needle which freely moves along a direction substantially perpendicular to the bottom surface of the wafer rest, and a front tip of the connection needle is pressed toward the wafer using restitutive force of an elastic spring.

10. The power supplier according to claim 8, further comprising a temperature sensor which freely moves along a direction substantially perpendicular to the bottom surface of the wafer rest, wherein the temperature of the wafer is measured by pressing a front tip of the temperature sensor toward the wafer using restitutive force of an elastic spring until the front tip contacts the wafer.

* * * * *